US007006562B2

(12) United States Patent
Chou

(10) Patent No.: US 7,006,562 B2
(45) Date of Patent: Feb. 28, 2006

(54) PHASE DEMODULATOR, PHASE DIFFERENCE DETECTOR, AND INTERFEROMETRIC SYSTEM USING THE PHASE DIFFERENCE DETECTOR

(76) Inventor: Chien Chou, 5F, No. 37-3, Chuan-Yuan Rd., Pei-Tou Dist., Taipei City (TW)

( * ) Notice: Subject to any disclaimer, the term of this patent is extended or adjusted under 35 U.S.C. 154(b) by 740 days.

(21) Appl. No.: 09/804,830

(22) Filed: Mar. 13, 2001

(65) Prior Publication Data

US 2001/0028679 A1 Oct. 11, 2001

(30) Foreign Application Priority Data

Mar. 17, 2000 (TW) .............................. 89104991 A
Apr. 11, 2000 (TW) .............................. 89106723 A
Apr. 18, 2000 (TW) .............................. 89107309 A

(51) Int. Cl.
    G01B 9/02 (2006.01)
    H04B 17/00 (2006.01)
(52) U.S. Cl. ..................................... 375/226; 356/450
(58) Field of Classification Search ............... 375/226; 329/345, 346, 347; 356/450, 491, 492; 359/237, 359/325, 279; 332/144; 376/226; 398/184, 398/185, 186, 188; 382/144

See application file for complete search history.

(56) References Cited

U.S. PATENT DOCUMENTS

| 3,793,592 A | * | 2/1974 | Matonak et al. ............ 329/346 |
| 4,339,726 A | * | 7/1982 | Miura ........................ 329/337 |
| 4,559,499 A | * | 12/1985 | Bursztejn et al. ........... 329/309 |
| 4,842,408 A | * | 6/1989 | Yoshii et al. ............... 356/489 |
| 4,888,558 A | * | 12/1989 | Hereikson ................... 329/345 |
| 5,052,051 A | * | 9/1991 | Naito et al. ................. 398/204 |
| 5,295,013 A | * | 3/1994 | Ono ........................... 398/205 |
| 5,473,457 A | * | 12/1995 | Ono ........................... 398/185 |
| 5,486,919 A | * | 1/1996 | Tsuji et al. ................. 356/484 |
| 5,861,952 A | * | 1/1999 | Tsuji et al. ................. 356/484 |
| 5,923,706 A | * | 7/1999 | Marz .......................... 375/226 |
| 6,018,391 A | * | 1/2000 | Yoshida ...................... 356/484 |

* cited by examiner

*Primary Examiner*—Chieh M. Fan
*Assistant Examiner*—Jason M Perilla
(74) *Attorney, Agent, or Firm*—Chien Chou

(57) ABSTRACT

A phase demodulator is used for measuring a phase difference between a phase-modulated test signal and a phase-modulated reference signal having fixed carrier frequencies. The phase demodulator includes an amplitude control device for adjusting amplitudes of the test and reference signals. A differential amplifier receives amplitude-adjusted test and reference signals from the amplitude control device, obtains an intensity difference between the amplitude-adjusted test and reference signals, and amplifies the intensity difference to generate an amplitude-modulated output. An amplitude demodulator demodulates the amplitude-modulated output to obtain an output that is related to the phase difference.

20 Claims, 9 Drawing Sheets

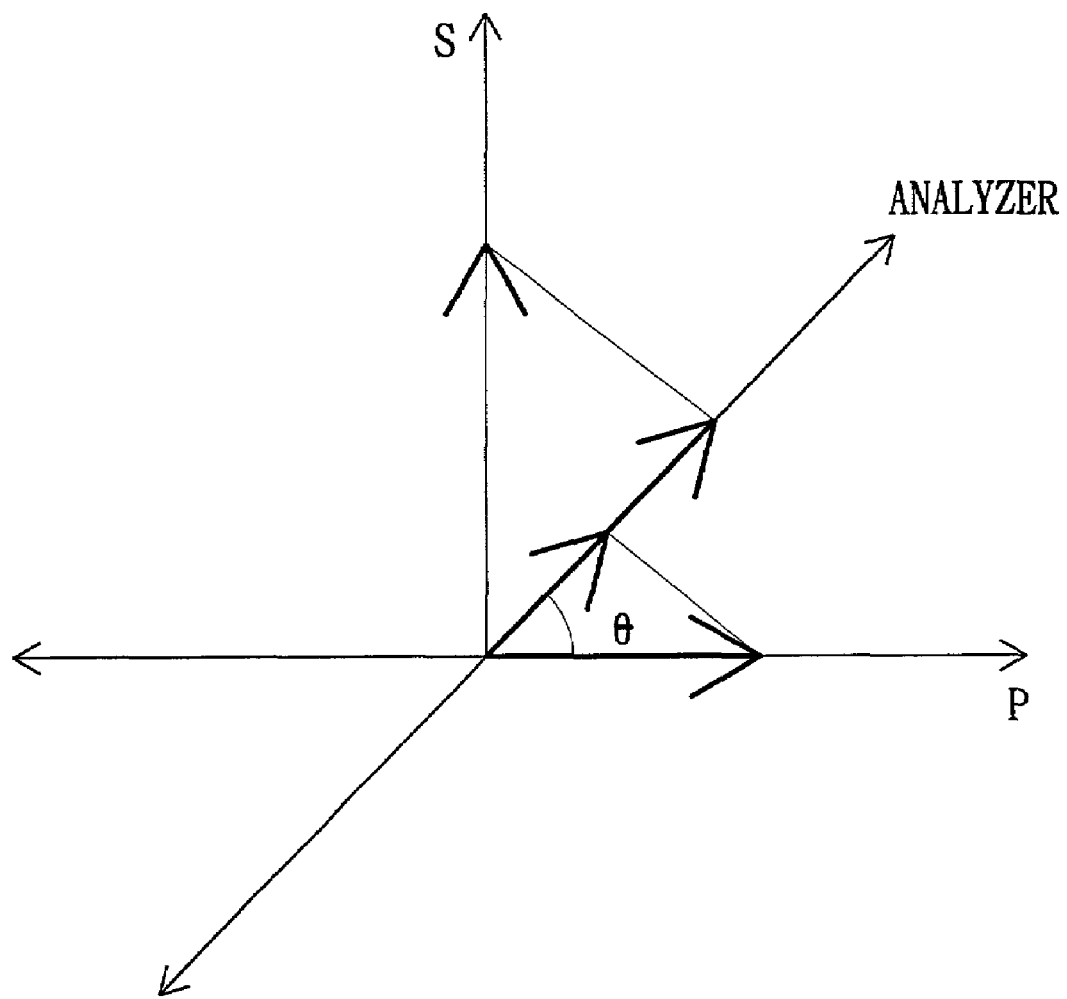
F I G. 4

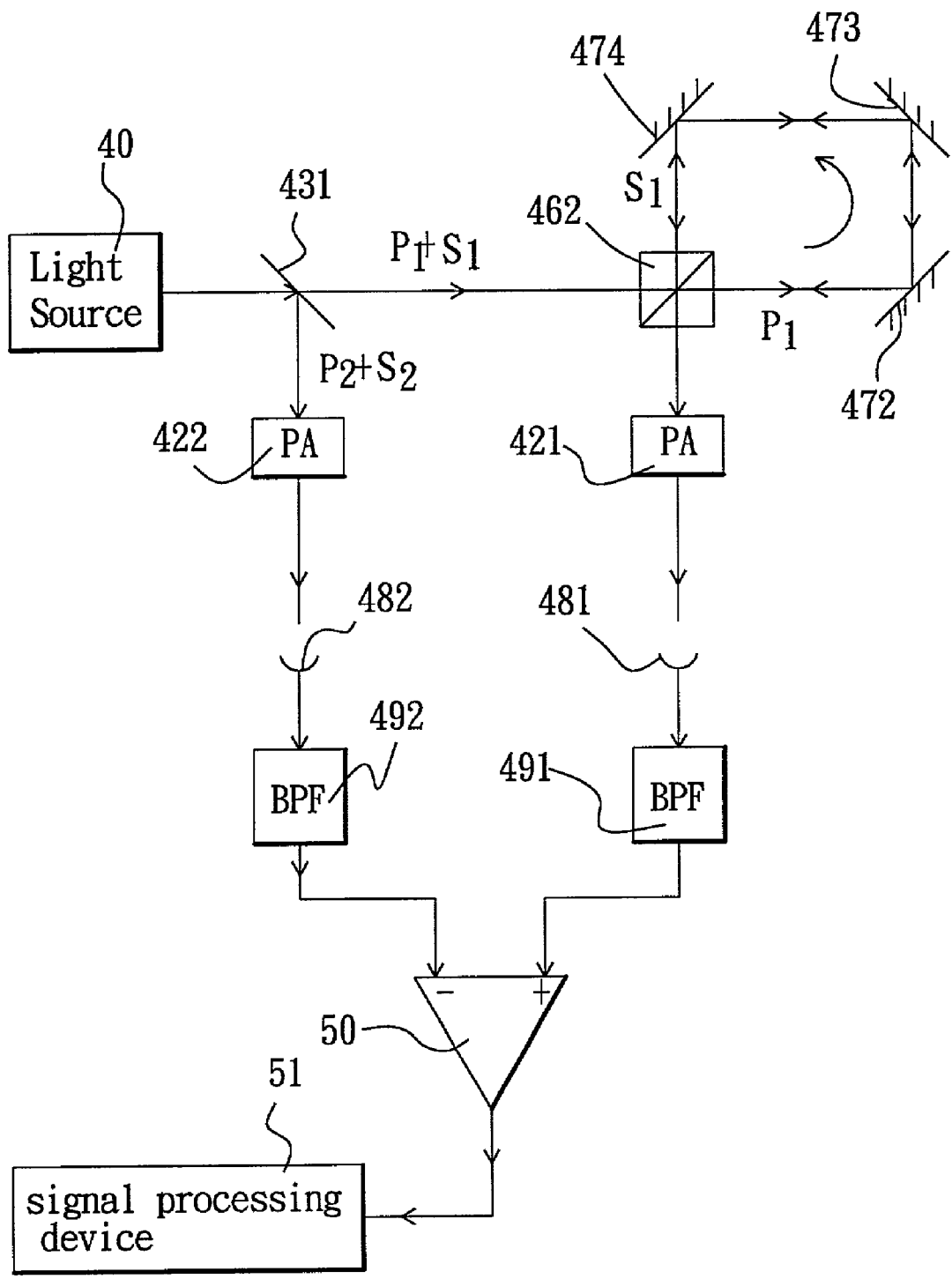
F I G. 6

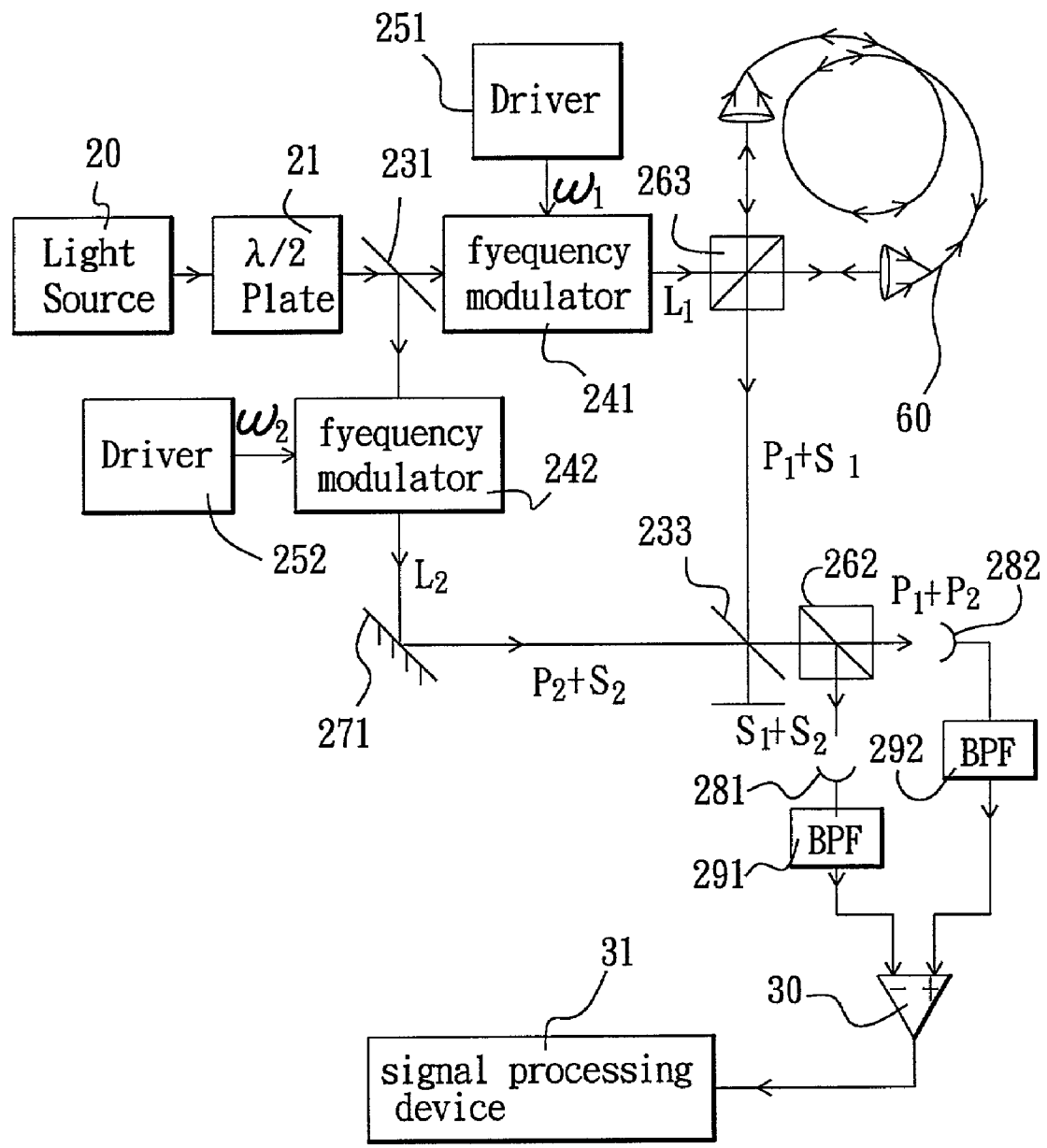
F I G. 7

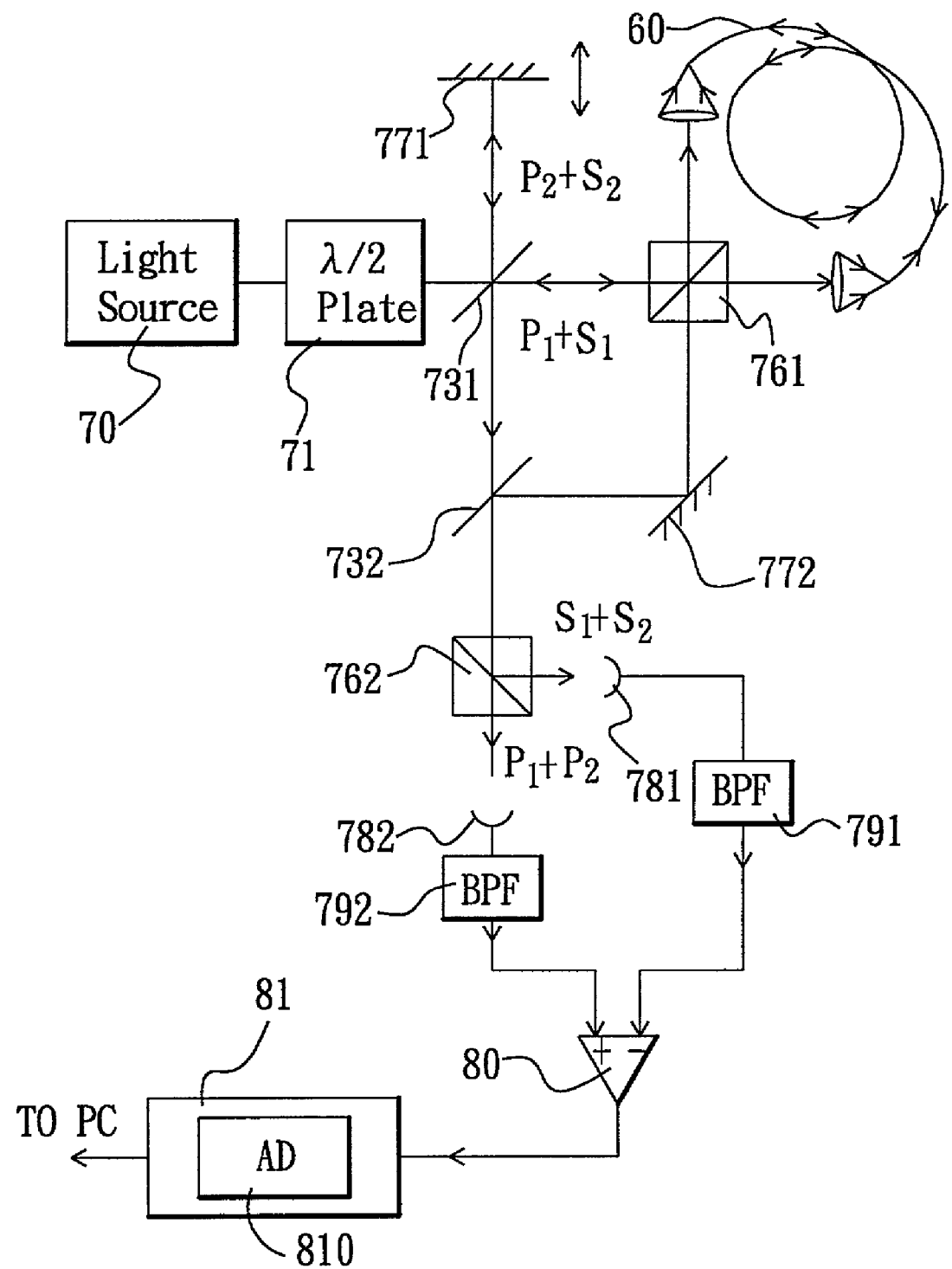
F I G. 8

PHASE DEMODULATOR, PHASE DIFFERENCE DETECTOR, AND INTERFEROMETRIC SYSTEM USING THE PHASE DIFFERENCE DETECTOR

BACKGROUND OF THE INVENTION

1. Field of the Invention

The invention relates to a phase demodulator, a phase difference detector and an interferometric system using the phase difference detector in which phase-modulated signals are transformed into amplitude-modulated signals for real-time measurement.

2. Description of the Related Art

A phase demodulator is used to demodulate phase-modulated signals, and is widely employed in the fields of communication, data transmission and interferometry. A conventional phase demodulator can include a phase-sensitive detector and a phase-locked loop for demodulation purposes. Alternatively, the output of a zero-crossing circuit for frequency-modulated signals can be fed to a counter so as to detect frequency counts ($f_s$) for a test signal, from which the frequency counts ($f_r$) for a reference signal is subtracted to obtain a frequency difference ($\Delta f$), i.e. $\Delta f = f_s - f_r$. Phase change is then detected with the use of an integrating circuit. Furthermore, a digital phase comparator can be employed to measure the phase difference between test and reference signals. A voltage signal is then outputted according to the magnitude of the output of the phase comparator. In the aforesaid conventional methods, phase difference, and thus the measured phase, is obtained by comparing test and reference signals using analog or digital means.

On the other hand, in the field of interferometry, phase changes are generally measured on the bases of light wavelength and optical interference in order to measure displacement, angle, length, vibration and other physical properties. Lasers are used as light sources for such interferometers. It is noted that changes in environmental conditions, such as temperature, can reduce the accuracy of phase measurement by optical interferometers. It has been proposed heretofore to construct optical interferometers with a common path configuration in order to minimize background noise due to environmental disturbance during operation thereof.

SUMMARY OF THE INVENTION

One object of the present invention is to provide a novel phase demodulator that transforms phase-modulated signals into amplitude-modulated signals. Real-time and highly-sensitive phase measurement is then performed by measuring the magnitude of the amplitude-modulated signals.

Another object of the present invention is to provide a real-time phase difference detector, wherein optical signals from a laser interferometer are processed by a differential amplifier to generate an amplitude-modulated output signal for fast response and accuracy.

Still another object of the present invention is to provide a high-precision non-contacting polarized optical interferometric system using the real-time phase difference detector, wherein increasing or decreasing direction of phase change can be detected and accurately indicated.

According to a first aspect of this invention, a phase demodulator is used for measuring a phase difference between a phase-modulated test signal $I_s(\omega t) = 2 k_1 \cos(\omega t + \phi_s)$ and a phase-modulated reference signal $I_r(\omega t) = 2 k_2 \cos(\omega t + \phi_r)$. The test and reference signals have fixed carrier frequencies ($\omega$) The phase difference ($\Delta\phi$) is equal to ($\phi_s - \phi_r$). The phase demodulator comprises:

an amplitude control device for adjusting amplitudes of the test and reference signals to satisfy the condition $k_1 = k_2 = k$;

a differential amplifier, coupled to the amplitude control device, for receiving amplitude-adjusted test and reference signals from the amplitude control device, for obtaining an intensity difference between the amplitude-adjusted test and reference signals, and for amplifying the intensity difference to generate an amplitude-modulated output $I_{out}(\omega t)$ equal to |4 γk sin(½Δφ)|sin(ωt), where γ is the gain of the differential amplifier; and a signal processing device including an amplitude demodulator coupled to the differential amplifier, the amplitude demodulator demodulating the amplitude-modulated output from the differential amplifier to obtain an output that is related to the phase difference ($\Delta\phi$).

According to a second aspect of this invention, a phase difference detector is adapted for use with a polarized optical interferometer that generates two mutually orthogonal linear or circular polarized optical signals, at least one of which is incident upon latest object. The optical signals have equal intensities and carrier frequencies, and are processed to obtain two electrical signals that are a function of frequency, time, and phase difference. The phase difference detector comprises:

a differential amplifier adapted to receive the electrical signals, to obtain an intensity difference between the electrical signals, and to amplify the intensity difference to generate an amplitude-modulated output that is a function of a phase difference between the electrical signals; and a signal processing device including an amplitude demodulator coupled to the differential amplifier, the amplitude demodulator demodulating the amplitude-modulated output from the differential amplifier to obtain an output that is related to the phase difference.

According to a third aspect of this invention, an interferometric system comprises:

a coherent light source;

an interferometer for separating light from the light source into a signal beam and a reference beam, each of which includes two mutually orthogonal linear polarized components, the signal and reference beams having a beat frequency therebetween, at least one of the components of the signal beam being incident upon a test object, the signal and reference beams being combined and then separated into two mutually orthogonal linear polarized optical heterodyned signals that have equal intensities and equal carrier frequencies and that are a function of the beat frequency, time, and phase difference between the linear polarized components;

photo detecting means for converting the optical heterodyned signals into two electrical signals;

a differential amplifier coupled to the photo detecting means so as to receive the electrical signals therefrom, the differential amplifier obtaining an intensity difference between the electrical signals, and amplifying the intensity difference to generate an amplitude-modulated output that is a function of a phase difference between the optical heterodyned signals; and a signal processing device including an amplitude demodulator coupled to the differential amplifier, the amplitude demodulator demodulating the amplitude-modulated output from the differential amplifier to obtain an output that is related to the phase difference.

According to a fourth aspect of this invention, an interferometric system comprises:

a coherent light source;

an interferometer for separating light from the light source into a signal beam and a reference beam, each of which includes two mutually orthogonal linear polarized components, the linear polarized components of the signal and reference beams having a beat frequency therebetween, at least one of the components of the signal beam being incident upon a test object, the signal and reference beams being converted into two optical heterodyned signals that have equal intensities and carrier frequencies and that are a function of the beat frequency, time, and phase difference between the mutually orthogonal linear polarized components;

photo detecting means for converting the optical heterodyned signals into two electrical signals;

a differential amplifier coupled to the photo detecting means so as to receive the electrical signals therefrom, the differential amplifier obtaining an intensity difference between the electrical signals, and amplifying the intensity difference to generate an amplitude-modulated output that is a function of a phase difference between the optical heterodyned signals; and a signal processing device including an amplitude demodulator coupled to the differential amplifier, the amplitude demodulator demodulating the amplitude-modulated output from the differential amplifier to obtain an output that is related to the phase difference.

BRIEF DESCRIPTION OF THE DRAWINGS

Other features and advantages of the present invention will become apparent in the following detailed description of the preferred embodiments with reference to the accompanying drawings, of which:

FIG. 4 illustrates the effect of a polarization analyzer used in the embodiment of FIG. 3 on P-wave and S-wave components of a light beam;

FIG. 6 illustrates a modification of the interferometric system of FIG. 3;

FIG. 7 illustrates a modification of the interferometric system of FIG. 5;

FIG. 8 illustrates yet another preferred embodiment of an interferometric system according to the present invention.

DETAILED DESCRIPTION OF THE PREFERRED EMBODIMENTS

Figure 1:
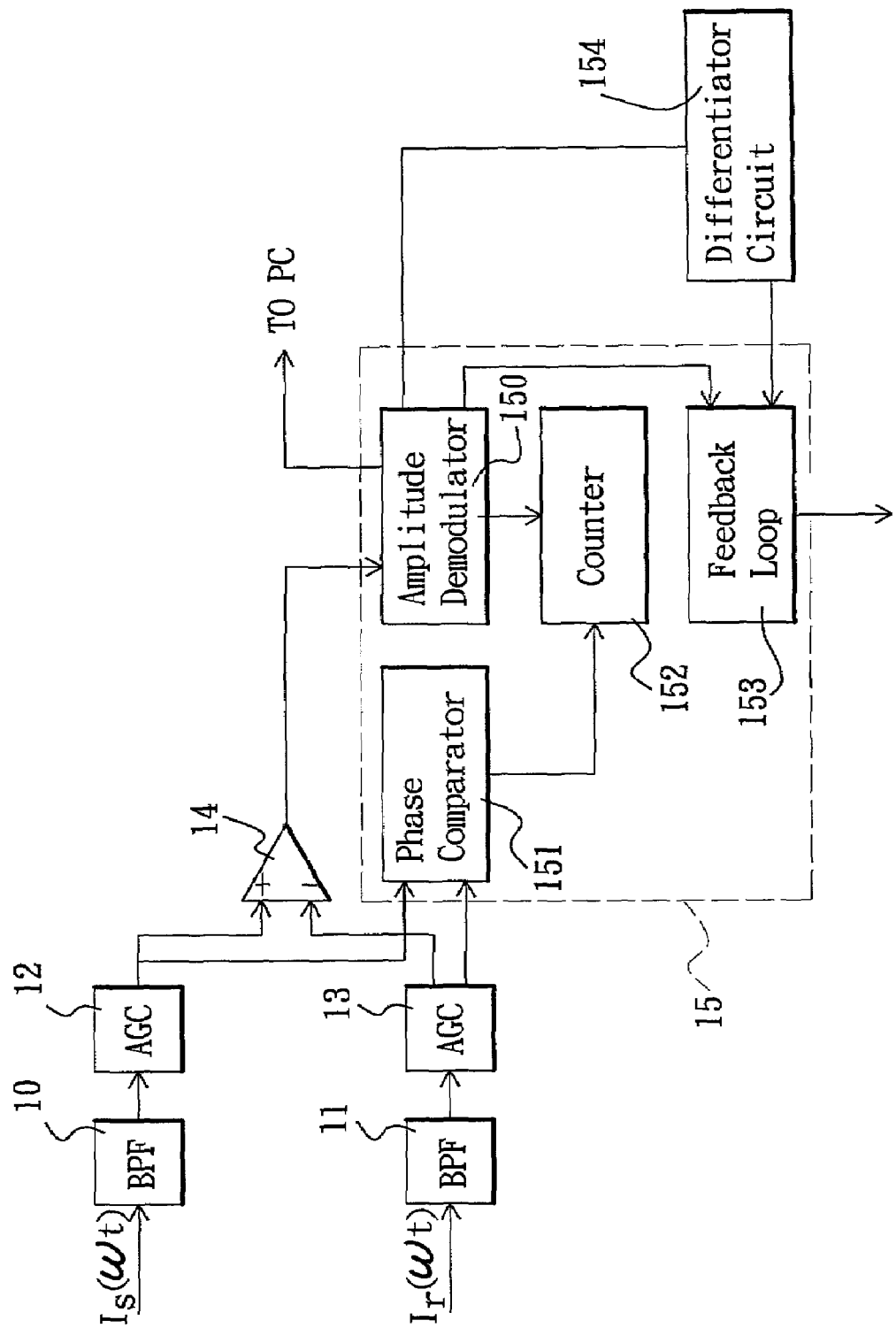
FIG. 1 is a block diagram illustrating the preferred embodiment of a phase demodulator according to the present invention.

Before the present invention is described in greater detail, it should be noted that like elements are denoted by the same reference numerals throughout the disclosure.

Referring to FIG. 1, in the preferred embodiment of a phase demodulator according to the present invention, phase-modulated test signal $I_s(\omega t)=DC+2\ k_1\ \cos(\omega t+\phi_s)$ (Equation 1) and phase-modulated reference signal $I_r(\omega t)=DC+2\ k_2\ \cos(\omega t+\phi_r)$ (Equation 2) are passed respectively through two band-pass filters (BPF) 10, 11, whose center frequencies are set at a fixed carrier frequency ($\omega$), for filtering. ($k_1$, $k_2$) are the amplitudes of the phase-modulated test and reference signals, respectively. ($\phi_s$, $\phi_r$) are the phases of the phase-modulated test and reference signals, respectively. The outputs of the filters 10, 11, namely $I_s(\omega t)=2\ k_1\ \cos(\omega t+\phi_s)$ (Equation 3) and $I_r(\omega t)=2\ k_2\ \cos(\omega t+\phi_r)$ (Equation 4), are then fed to an amplitude control device. In this embodiment, the amplitude control device includes two automatic gain control (AGC) units 12, 13, which process the test and reference signals such that the latter have equal amplitudes, i.e. $k_1=k_2=k$. In other words, by the processing of the AGC units 12, 13, the phase-modulated test signal $I_s$ becomes $I_s(\omega t)=2\ k\ \cos(\omega t+\phi_s)$ (Equation 5), whereas the phase-modulated reference signal $I_r$ becomes $I_r(\omega t)=2\ k\ \cos(\omega t+\phi_r)$ (Equation 6). By introducing a phase shift $\frac{1}{2}(\phi_s+\phi_r)$, the phase-modulated test and reference signals $I_s$, $I_r$ can be represented by $I_s(\omega t)=2\ k\ \cos[\omega t+\frac{1}{2}(\phi_s-\phi_r)]$ (Equation 7) and $I_r(\omega t)=2\ k\ \cos[\omega t-\frac{1}{2}(\phi_s-\phi_r)]$ (Equation 8). Although the phase shift $\frac{1}{2}(\phi_s+\phi_r)$ is an unknown term, it can be treated as a time-dependent phase shifting of the origin of the phase coordinates. As such, the above phase shift in the phase coordinate of the phase-modulated test and reference signals $I_s$, $I_r$ does not introduce any physical change in the phase difference $\Delta\phi=\phi_s-\phi_r$ of the output signal from the succeeding differential amplifier stage.

The amplitude-adjusted test and reference signals from the AGC units 12, 13, which have equal carrier frequencies and equal amplitudes, are fed to a differential amplifier 14. The differential amplifier 14 obtains an intensity difference between the amplitude-adjusted test and reference signals, and amplifies the intensity difference to generate an amplitude-modulated (AM) output $I_{out}(\phi t)=|4\ \gamma k\ \sin(\frac{1}{2}\Delta\phi)|\sin(\omega t)$ (Equation 9), where $\Delta\phi=\phi_s-\phi_r$, and $\gamma$ is the gain of the differential amplifier 14. At this time, the phase difference ($\Delta\phi$) can be detected by a signal processing device 15, such as a digital voltmeter (DVM) or a personal computer (PC), by the relation of $\Delta\phi=2\ \sin^{-1}(|I_{out}|/4\ \gamma k)$ (Equation 10). When $|\Delta\phi|<10°$, $\sin(x)$ is approximately equal to $(x)$, and the amplitude-modulated output $I_{out}(\omega t)$ from the differential amplifier 14 becomes $$I_{out}(\omega t)=|2\ \gamma k(\Delta\phi)|\sin(\omega t) \qquad \text{Equation 11}$$

Because the phase difference ($\Delta\phi$) is proportional to the magnitude of the amplitude-modulated output $I_{out}(\Omega t)$, the phase-modulated (PM) input signals are thus transformed into an amplitude-modulated (AM) signal. A novel PM/AM transformation is thus proposed. An amplitude demodulator 150 of the signal processing device 15 can thereby detect the phase difference ($\Delta\phi$) in real-time to dramatically improve the measurement response speed and accuracy. In addition, because the phase signal $|\sin(\frac{1}{2}\Delta\phi)|$ to be detected is amplified by $4\gamma k$ times, and because the phase difference ($\Delta\phi$) can be obtained in view of the relation in Equation 10, the phase measuring sensitivity is dramatically improved at the same time.

Preferably, the signal processing device 15 includes a phase comparator 151. The phase comparator 151 compares the amplitude-adjusted test and reference signals from the AGC units 12, 13 so as to determine the sign of the phase difference (Δϕ) in real time, thereby determining an increasing or decreasing direction of the phase difference (Δϕ). The signal processing device 15 can further include a digital counter 152. As such, when the phase difference is represented as Δϕ=2n π+δ, where n is an integer, and δ is between 0 and π, the counter 152 can record n pulse signals from the amplitude-demodulator output, and the signal processing device 15 can measure the phase difference (δ) from the magnitude |4 γk sin(½δ)| of the amplitude-modulated output. The variables (n, δ) define the phase difference (Δϕ), thereby extending the range of measurable phase change.

Moreover, in case the phase difference |Δϕ| is less than 10°, the magnitude of the amplitude-modulated output $I_{out}$ from the differential amplifier 14 is |2 γk(Δϕ)|, and the signal processing device 15 can be configured to include a feedback loop 153 capable of generating a control signal that corresponds to the phase difference (Δϕ) for phase-difference nulling purposes. In addition, the signal processing device 15 can further include a differentiator circuit 154 for time differentiation of the amplitude-modulated output $I_{out}$ from the differential amplifier 14, i.e. d/dt|2 γk(Δϕ)|=2 γk d/dt(Δϕ)=2 γkω$_s$. As such, real time measurement of the instantaneous signal frequency (ω$_s$) can be performed for frequency demodulation purposes with a measurement sensitivity of as high as 2 γk times, and with a dramatically improved measurement response.

By introducing a preset bias (Δϕ$_o$) the amplitude-modulated output from the differential amplifier 14 can be represented as $I_{out}$(ωt)=|4 γk sin ½(Δϕ+ϕ$_o$)| sin(ωt), where (Δϕ$_o$) has a fixed value between 0 and π. When the preset bias (Δϕ$_o$) is equal to ½π, |$I_{out}$| has a center of symmetry with respect to the preset bias (Δϕ$_o$) such that a change in the amplitude of |$I_{out}$| can indicate the increasing or decreasing direction of change in the phase difference (Δϕ).

Figure 2:
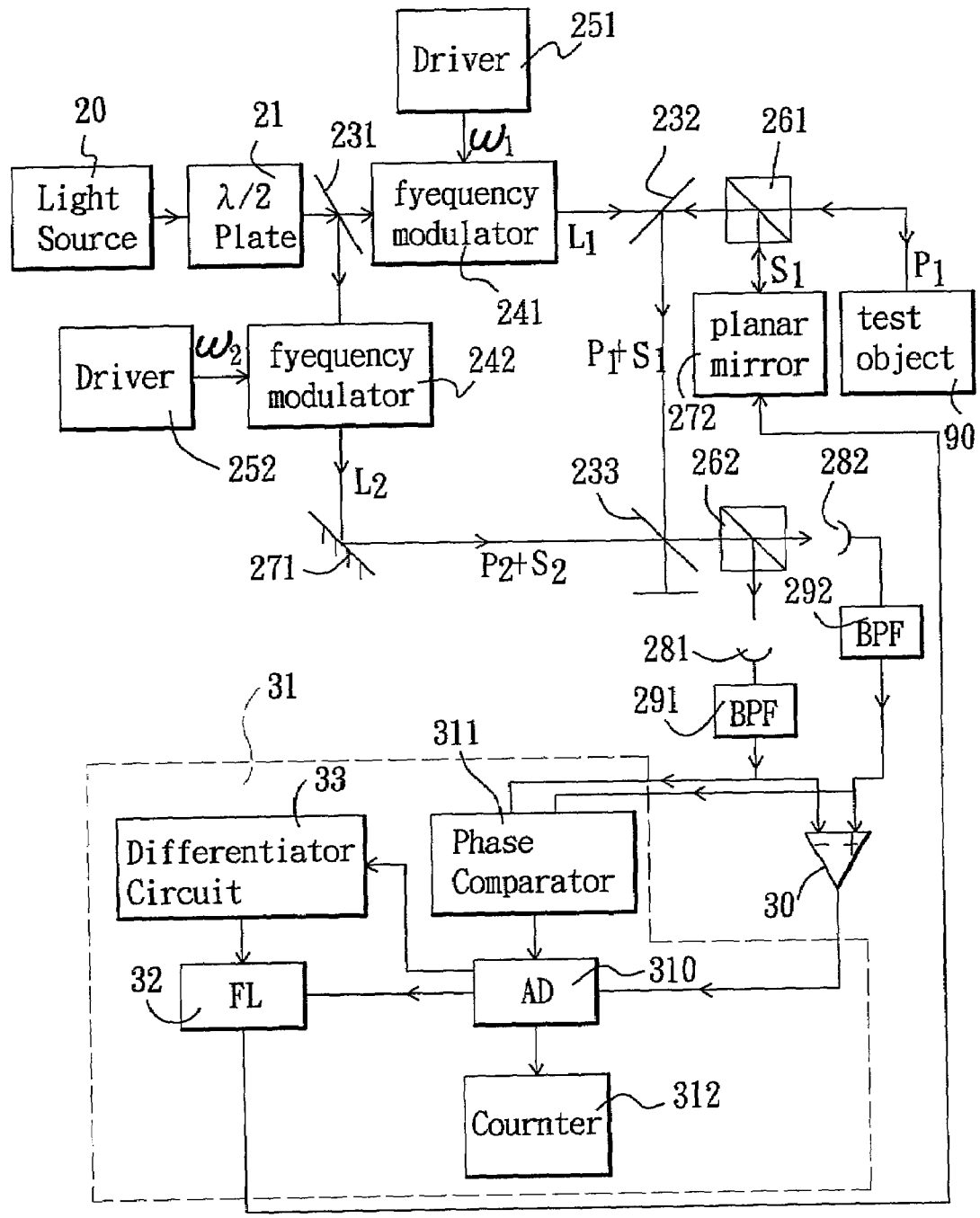
FIG. 2 is a schematic diagram illustrating the preferred embodiment of an interferometric system according to the present invention.

Referring to FIG. 2, in the preferred embodiment of an interferometric system according to this invention, the phase difference detector of FIG. 1 is integrated with a polarized optical common path interferometer that processes optical signals. As shown, polarized light from a coherent light source 20, such as a single-frequency linear-polarized stabilized He—Ne laser, passes through a polarization angle adjusting device 21, such as a λ/2 plate, for adjusting the azimuth angle. A beam splitter 231 then separates the light into a signal beam $L_1$ to be directed to a test object 90, and a reference beam $L_2$.

The signal beam $L_1$ and the reference beam $L_2$ are processed by a respective frequency modulator 241, 242. In this embodiment, each of the frequency modulators 241, 242 is an acousto-optic modulator (AOM). Each of the frequency modulators 241, 242 is driven by a corresponding driver 251, 252 such that the frequency of the signal beam $L_1$ is adjusted to ω$_1$, and such that the frequency of the reference beam $L_2$ is adjusted to ω$_2$. In other words, a beat frequency (Δω) is formed after the light is split into two. It is apparent to those skilled in the art that an electro-optic modulator or other state-of-the-art devices can be used as the frequency modulator instead of the acousto-optic modulator of this embodiment.

The signal beam $L_1$ further passes through a beam splitter 232 and a polarized beam splitter 261 so as to be separated into linear polarized $P_1$ and $S_1$ components whose electromagnetic field oscillations are mutually orthogonal. At least one of the $P_1$ and $S_1$ components is incident upon and is reflected by the test object 90. In this embodiment, the $P_1$ component is incident upon and is reflected by the test object 90, whereas the $S_1$ component is incident upon and is reflected by a planar mirror 272. The reflected $P_1$ and $S_1$ components pass once again through the polarized beam splitter 261 before being directed by the beam splitter 232 to a beam splitter 233.

The reference beam $L_2$ from the frequency modulator 242 is reflected by a mirror 271 such that mutually orthogonal linear polarized $P_2$ and $S_2$ components thereof can be combined with the $P_1$ and $S_1$ components at the beam splitter 233. The output of the beam splitter 233 is received by a polarized beam splitter 262 so as to generate mutually orthogonal linear polarized P-wave (i.e. $P_1+P_2$) and S-wave (i.e. $S_1+S_2$) optical heterodyned signals. The P-wave and S-wave optical heterodyned signals are detected by a respective photo detector 281, 282 for conversion into a corresponding electrical signal output. The electrical signal outputs from the photo detectors 281, 282 are provided to a respective band pass filter (BPF) 291, 292, whose center frequency is Δω=ω$_1$−ω$_2$, so as to obtain filtered heterodyned signals with a fixed frequency, as defined in the following Equations (12) and (13):

$$I_{P1+P2}(\Delta\omega t)=2\sqrt{I_{P1}I_{P2}}\cos(\Delta\omega t+\Delta\phi_P) \quad (12)$$

$$I_{S1+S2}(\Delta\omega t)=2\sqrt{I_{S1}I_{S2}}\cos(\Delta\omega t+\Delta\phi_S) \quad (13)$$

A differential amplifier 30 receives the filtered heterodyned signals, obtains an intensity difference between the filtered heterodyned signals, and amplifies the intensity difference to generate an output. The output of the differential amplifier 30 is defined in the following Equation (14):

$$I_{out}(\Delta\omega t)=\gamma[I_{P1+P2}(\Delta\omega t)-I_{S1+S2}(\Delta\omega t)] \quad (14)$$

In Equations (12) to (14), ($I_{P1}$, $I_{P2}$) are the intensities of the linear polarized $P_1$ and $P_2$ components, ($I_{S1}$, $I_{S2}$) are the intensities of the linear polarized $S_1$ and $S_2$ components, Δϕ$_P$ is the phase difference between the linear polarized $P_1$ and $P_2$ components, Δϕ$_S$ is the phase difference between the linear polarized $S_1$ and $S_2$ components, ϕ$_{107}$ is the beat frequency of the heterodyned signals, and γ is the gain of the differential amplifier 30.

By adjusting the azimuth angle (θ) of the polarization angle adjusting device 21 such that $\sqrt{I_{S1}I_{S2}}=\sqrt{I_{P1}I_{P2}}=K$, Equations (12) and (13) can be rewritten as follows:

$$I_{P1+P2}(\Delta\omega t)=2K\cos(\Delta\omega t+\Delta\phi_P) \quad (15)$$

$$I_{S1+S2}(\Delta\omega t)=2K\cos(\Delta\omega t+\Delta\phi_S) \quad (16)$$

In addition, by introducing a phase shift ½(Δϕ$_P$+Δϕ$_S$) in the phase coordinate of Equations (15) and (16), the following Equations (17) and (18) can be obtained:

$$I_{P1+P2}(\Delta\omega t)=2K\cos[\Delta\omega t+\tfrac{1}{2}(\Delta\phi_P-\Delta\phi_S)] \quad (17)$$

$$I_{S1+S2}(\Delta\omega t)=2K\cos[\Delta\omega t-\tfrac{1}{2}(\Delta\phi_P-\Delta\phi_S)] \quad (18)$$

As mentioned hereinbefore, the above phase shift in the phase coordinate does not introduce any physical change in the phase difference of the output signal from the succeeding differential amplifier stage.

Thus, in view of the foregoing, the output of the differential amplifier 30 can be rewritten as follows:

$$I_{out}(\Delta\omega t)=|4\,\gamma K\sin(\tfrac{1}{2}\Delta\phi)|\sin(\Delta\omega t) \quad \text{Equation 19}$$

where Δϕ=ϕ$_P$−ϕ$_S$, and is the phase difference between the P-wave and S-wave heterodyned signals, and |4 γK sin (½Δϕ)| is the amplitude of the amplifier output. It is evident from Equation (19) that the output $I_{out}$(Δωt) of the differential amplifier 30 is an amplitude-modulated signal with a carrier frequency $\Delta\omega=\omega_1-\omega_2$. $(\omega_1, \omega_2)$ are the driving frequencies of the frequency modulators 241, 242 of the Mach-Zender interferometer.

In the present embodiment, a signal processing device 31 includes an amplitude demodulator (AD) 310 to measure the amplitude $|4\gamma K \sin(\frac{1}{2}\Delta\phi)|$ of the amplifier output $I_{out}(\Delta\omega t)$ in real-time. The phase difference $(\Delta\phi)$ is then obtained in the following manner: $\Delta\phi=2\sin^{-1}[|I_{out}|/4\gamma K]$.

When the reference mirror is displaced along the optical axis until $|I_{out}|$ is maximized, $|I_{out}|_m$ will be equal to $4\gamma K$. The output of the amplitude demodulator 310 at this time is $\Delta\phi=2\sin^{-1}[|I_{out}|/|I_{out}|_m]$. When displacement of the test object 90 occurs, a phase shift will occur in the phase difference $(\Delta\phi_P)$. This phase shift will be indicated as a change in the amplitude of the final $|I_{out}|$ output.

It should be apparent to those skilled in the art that the interferometric system of this embodiment can be modified by interchanging the $P_1$ and $S_1$ components, i.e. the $S_1$ component is incident upon and is reflected by the test object 90, whereas the $P_1$ component is incident upon and is reflected by the planar mirror 272. When measuring relative movement or vibration of different positions of a rotary plate or a magnetic disk drive, the $P_1$ and $S_1$ components can be configured to be incident upon and to be reflected by different portions of the test object. Moreover, the light source can be one that generates two mutually orthogonal circular polarized components for conducting measurement.

In the present embodiment, the interferometric system includes a phase difference detector formed from the differential amplifier 30 and the signal processing device 31. In the field of interferometer measurement, the differential amplifier is generally used only for reducing common noise present in two heterodyned signals. However, according to this invention, the differential amplifier 30 is used not only for reducing common noise present in two heterodyned signals, but also for opto-electric conversion processing such that the phase difference $(\Delta\phi=\Delta\phi_P-\Delta\phi_S)$, which is obtained from Equations (12) and (13), can be directly manifested in the form of an amplitude-modulated electric signal. With the amplitude demodulator 310 of the signal processing device 31, the phase difference $(\Delta\phi)$ can be obtained from the amplitude of the differential amplifier output, thereby resulting in a remarkable increase in detection sensitivity and sensing speed. Moreover, when the phase difference $(\Delta\phi)$ is relatively small, in view of the mathematical relation $\sin(x)$ is approximately equal to $(x)$, representation of the amplitude of the differential amplifier output can be further simplified as follows:

$$|I_{out}|=|4\gamma K \sin(\tfrac{1}{2}\Delta\phi)|=|2\gamma K\Delta\phi| \qquad \text{Equation 20}$$

According to Equation (20), the measured amplitude-modulated signal $2\gamma K\Delta\phi$ is directly proportional to the phase difference $(\Delta\phi)$. The measuring sensitivity is $2\gamma K$ times of the phase difference $(\Delta\phi)$, which is much higher than that obtained in the prior art.

With the inclusion of a feedback loop (FL) 32, a control signal corresponding to the phase difference $(\Delta\phi)$ can be generated for adjusting the position of the planar mirror 272, thereby adjusting the optical path of the $S_1$ component. As such, the phase difference $(\Delta\phi)$ can be maintained within a narrow range that encompasses an initial phase difference value $(\Delta\phi_o)$ for phase nulling purposes. With the initial phase difference value $(\Delta\phi_o)$ set to zero, the magnitude of the amplifier output and the phase difference $(\Delta\phi)$ have a linear relationship, the slope of which is equal to $2\gamma K$. As such, real-time measurement of small phase differences can be conducted.

In the present embodiment, $(\Delta\phi)$ is the phase difference between the P-wave and S-wave heterodyned signals, which come respectively from a test point and a reference point that introduce a relative phase change or a relative angle due to a physical property, such as temperature, refractive index, electromagnetic field, etc. By employing the simple, fast and very familiar amplitude demodulation technology, the phase difference $(\Delta\phi)$ can be determined within a short amount of time such that the corresponding physical property can be measured accordingly. The interferometric system of this invention is thus suitable for real-time measurement of displacement, angle, length, speed, vibration, etc., and for application in optical sensors.

It is apparent to those skilled in the art that the present invention can be further applied in the real-time measurement and control of small displacements between two points, small angles, and small changes in measured physical properties. By incorporating a differentiator circuit 33 in the signal processing device 31, the amplifier output can be differentiated over time, i.e. $d/dt|I_{out}|=2\gamma K\, d/dt(\Delta\phi)$ such that the change of phase over time $d/dt(\Delta\phi)$ can be quickly obtained. Because the Doppler frequency shift $(\omega_D)$ is a measure of the instantaneous change in phase and is equal to $d/dt(\Delta\phi)$, the Doppler frequency shift $(\omega_D)$ can thus be measured from the magnitude of the amplitude-modulated output with a sensitivity of $2\gamma K$ times. This makes it possible to conduct real-time measurement of small vibrations on a test surface. According to the disclosure of the present invention, not only is it possible to conduct real-time measurement of vibrations and displacement, by incorporating the feedback loop for generating control signals according to the measured phase difference, it is also possible to lock-in on preset starting phase conditions for application in the relevant fields.

From the foregoing, because the amplitude of the amplitude-modulated output is a sine function of the phase difference, i.e. $|I_{out}|=|4\gamma K \sin(\frac{1}{2}\Delta\phi)|$, when the test object introduces a relatively large phase change, the phase difference $(\Delta\phi)$ can be represented as $2n\pi+\delta$, where n is an integer, and $\delta$ is between 0 and $\pi$. The signal processing device 31 can be additionally provided with a digital counter 312 for recording n pulse signals, such that the phase $(\delta)$ can be calculated from the amplitude $4\gamma K \sin(\frac{1}{2}\delta)$ by virtue of the relation $\delta=2\sin^{-1}(|I_{out}|/4\gamma K)$. In view of the variables (n, $\delta$), not only can the system of this invention make effective measurement of a relatively large range of phase changes, the rate of phase change can also be determined through the use of a differentiator circuit in order to measure speed, vibration and other physical quantities.

Preferably, the signal processing device 31 further includes a phase comparator 311, which receives the filtered heterodyned signals from the band pass filters 291, 292, for determining a sign of the phase difference $(\Delta\phi)$ so as to determine an increasing or decreasing direction of the phase difference $(\Delta\phi)$.

Moreover, because the position of the planar mirror 272 can be adjusted with the use of the control signal generated by the feedback loop 32 so as to adjust the optical path of the $S_1$ component, the phase difference between the P-wave and S-wave heterodyned signals can be preset to $\Delta\phi(t=0)=\Delta\phi_o$. Under this condition, the amplifier output can be rewritten as $I_{out}(\Delta\omega t)=|4\gamma K \sin[\frac{1}{2}(\Delta\phi+\Delta\phi_o)]\sin(\Delta\omega t)$. $(\Delta\phi_o)$ can be set to between 0 and $\pi$, so as to obtain the phase signal $(\Delta\phi(t))$.

Figure 3:
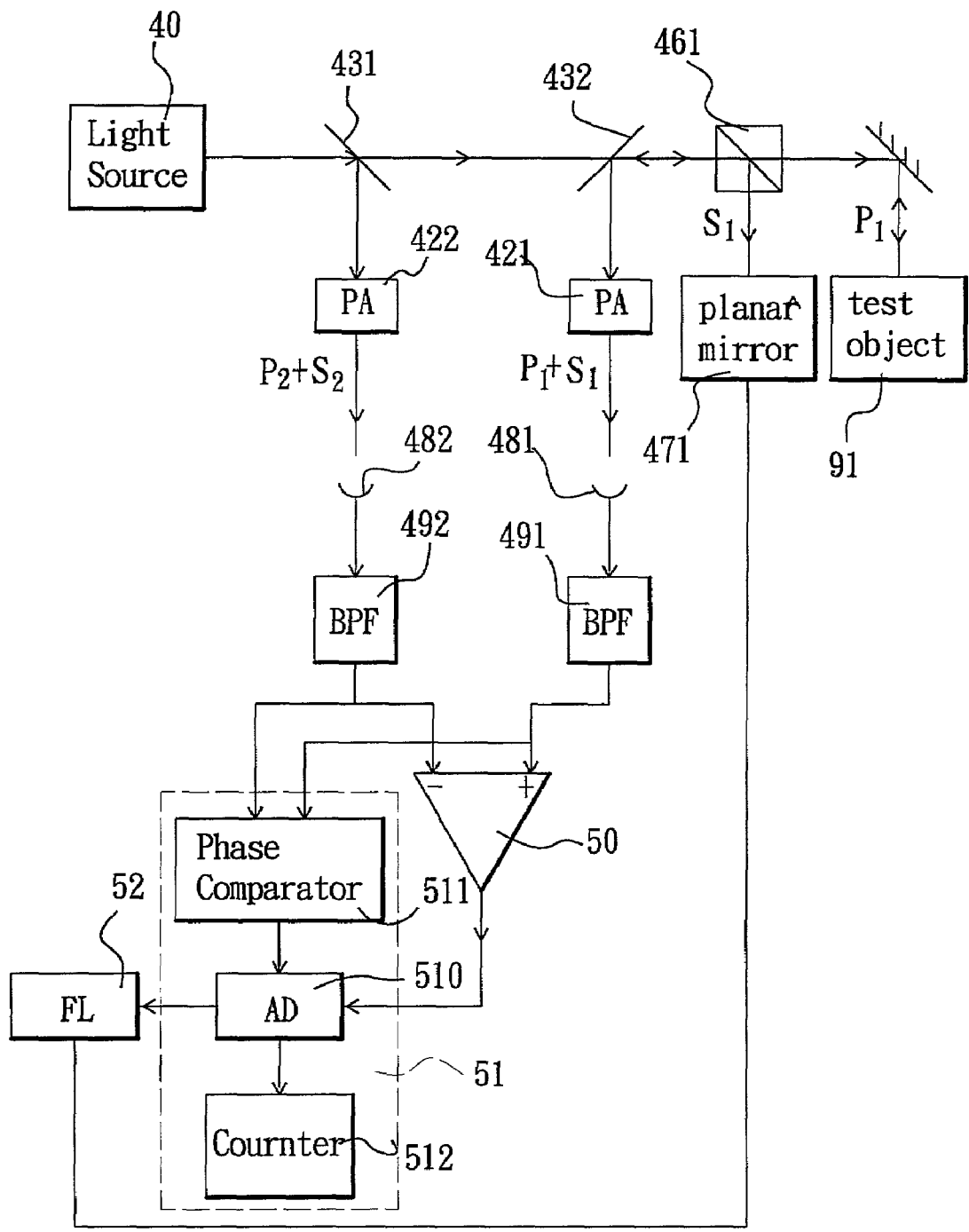
FIG. 3 is a schematic diagram illustrating another preferred embodiment of an interferometric system according to the present invention.

Referring to FIG. 3, aside from using the single-frequency He—Ne laser, the light source 40 in the interferometric system of this invention can be one that generates two mutually orthogonal linear polarized light components, i.e.

P-wave and S-wave, at two different frequencies. One example of the two-frequency light source is a Zeeman laser. A beam splitter 431 splits the light from the light source 40 into a reference beam $(P_2+S_2)$ and a signal beam $(P_1+S_1)$. The $P_2$ and $S_2$ components of the reference beam, which are mutually orthogonal and which do not interfere with each other, are passed through a polarization analyzer (PA) 422, thereby enabling the $P_2$ and $S_2$ components to interfere with each other along a polarizing direction of the polarization analyzer 422 to result in a reference optical heterodyned signal, as best shown in FIG. 4. A photo detector 482 converts the reference optical heterodyned signal into a corresponding electrical signal, which is filtered by a band pass filter (BPF) 492, whose center frequency is $\Delta\omega=\omega_P-\omega_S$. The output of the band pass filter 492 is provided to a differential amplifier 50. On the other hand, a polarized beam splitter 461 splits the signal beam into its mutually orthogonal linear polarized $P_1$ and $S_1$ components. In this embodiment, the $P_1$ component is configured to be incident upon and to be reflected by a test object 91, whereas the $S_1$ component is configured to be incident upon and to be reflected by a planar mirror 471. The reflected $P_1$ and $S_1$ components are recombined by the polarized beam splitter 461, and the path of the resulting combined signal beam is changed with the use of a beam splitter 432. The $P_1$ and $S_1$ components of the signal beam, which are mutually orthogonal and which do not interfere with each other, are subsequently passed through a polarization analyzer (PA) 421, thereby enabling the $P_1$ and $S_1$ components to interfere with each other along a polarizing direction of the polarization analyzer 421 to result in a test optical heterodyned signal. A photo detector 481 converts the test optical heterodyned signal from the polarization analyzer 421 into a corresponding electrical signal, which is filtered by a band pass filter (BPF) 491, whose center frequency is $\Delta\omega=\omega_P-\omega_S$. The output of the band pass filter 491 is provided to the differential amplifier 50. The heterodyned signal for the signal beam is indicated as follows:

$$I_{sig}(\Delta\omega t)=I_{P1+S1}(\Delta\omega t)=\sqrt{I_{P1}I_{S1}}\sin 2\theta_s \cos(\Delta\omega t \Delta\phi_{sig}) \quad \text{Equation 21}$$

where $\theta_s$ is the azimuth angle of the polarization analyzer 421 for the signal beam; $\Delta\phi_{sig}=\phi_{P1}-\phi_{S1}$ and is the phase difference between the $P_1$ and $S_1$ components; $\Delta\omega=\omega_P-\omega_S$, and is the beat frequency formed from the frequency $(\omega_P)$ of the $P_1$ component and the frequency $(\omega_s)$ of the $S_1$ component; and $(I_{P1}, I_{S1})$ are the intensities of the $P_1$ and $S_1$ components, respectively.

Accordingly, the heterodyned signal for the reference beam is indicated as follows:

$$I_{ref}(\Delta\omega t)=I_{P2+S2}(\Delta\omega t)=\sqrt{I_{P2}I_{S2}}\sin 2\theta_r \cos(\Delta\omega t+\Delta\phi_{ref}) \quad \text{Equation 22}$$

where $\theta_r$ is the azimuth angle of the polarization analyzer 422 for the reference beam; $\Delta\phi_{ref}=\phi_{P2}-\phi_{S2}$ and is the phase difference between the $P_2$ and $S_2$ components; $\Delta\omega=\omega_P-\omega_S$, and is the beat frequency formed from the frequency $(\omega_P)$ of the $P_2$ component and the frequency $(\omega_s)$ of the $S_2$ component; and $(I_{P2}, I_{S2})$ are the intensities of the $P_2$ and $S_2$ components, respectively.

Preferably, the azimuth angles $\theta_s$ and $\theta_r$ of the polarization analyzers 421, 422 for the signal and reference beams are adjustable so as to satisfy the condition $\sqrt{I_{P1}I_{S1}}\sin 2\theta_s=\sqrt{I_{P2}I_{S2}}\sin 2\theta_r=2\chi$. At this time, Equations (21) and (22) can be rewritten as follows:

$$I_{sig}(\Delta 107\ t)=I_{P1+S1}(\Delta\omega t)=2\chi \cos(\Delta\omega t+\Delta\phi_{sig}) \quad \text{Eq. 23}$$

$$I_{ref}(\Delta\omega t)=I_{P2+S2}(\Delta\omega t)=2\chi \cos(\Delta\omega t+\Delta\phi_{ref}) \quad \text{Eq. 24}$$

In addition, by introducing a phase shift $\frac{1}{2}(\Delta\phi_{sig}+\Delta\phi_{ref})$, Equations (23) and (24) can be rewritten as follows:

$$I_{sig}(\Delta\omega t)=2\chi \cos [\Delta\omega t+\frac{1}{2}(\Delta\phi_{sig}-\Delta\phi_{ref})] \quad \text{Eq. 25}$$

$$I_{ref}(\Delta\omega t)=2\chi \cos [\Delta\omega t-\frac{1}{2}(\Delta\phi_{sig}-\Delta\phi_{ref})] \quad \text{Eq. 26}$$

In view of the foregoing, the output of the differential amplifier 50 can be written as follows:

$$I_{out}(\Delta\omega t)=\gamma[I_{sig}(\Delta\omega t)-I_{ref}(\Delta\omega t)]=|4\ \gamma\chi \ \sin(\frac{1}{2}\Delta\phi)|\sin (\Delta\omega t) \quad \text{Equation 27}$$

where $\Delta\phi=\Delta\phi_{sig}-\Delta\phi_{ref}$, and is the phase difference between the reference and signal beams, and $\gamma$ is the gain of the differential amplifier 50. As mentioned hereinbefore, the phase shift in the phase coordinate in Equations (23) and (24) does not result in a change in the phase difference $\Delta\phi=\Delta\phi_{sig}-\Delta\phi_{ref}$ in the amplitude-modulated output signal from the differential amplifier 50.

Moreover, the interferometric system of this embodiment can further include a feedback loop 52 to generate a control signal that corresponds to the phase difference $(\Delta\phi)$ and that can be used to adjust the position of the planar mirror 471. As such, the optical path of the $S_1$ component unit can be adjusted so that the initial phase difference between the $(P_1+S_1)$ test heterodyned signal and the $(P_2+S_2)$ reference heterodyned signal can be set to $\Delta\phi(t=0)=\Delta\phi_o$. Under this condition, the output of the differential amplifier 50 can be rewritten as follows:

$$I_{out}(\Delta\omega t)=|4\ \gamma\chi \sin\ \frac{1}{2}(\Delta\phi+\Delta\phi_o)|\sin(\Delta\omega t) \quad \text{Eq. 28}$$

By setting $(\Delta\phi_o)$ to between 0 and $\pi$, the change in the phase signal $\Delta\phi(t)$ can be determined with $(\Delta\phi_o)$ as a bias setting such that the increasing or decreasing direction of phase change can be observed.

Furthermore, when the phase difference between the $(P_1+S_1)$ test heterodyned signal and the $(P_2+S_2)$ reference heterodyned signal satisfies the condition $\sin(\frac{1}{2}\Delta\phi)=(\frac{1}{2}\Delta\phi)$, $I_{out}(\Delta\omega t)=|2\ \gamma\chi(\Delta\phi)|\sin(\Delta\omega t)$, and the amplitude of the differential amplifier output $I_{out}(\Delta\omega t)$ is $2\ \gamma\chi$ times of the phase difference.

Like the previous embodiment, a phase comparator 511 receives the outputs of the band pass filters 491, 492, and determines the sign of the phase difference $(\Delta\phi)$ so as to determine the direction of change in the position of the test object 91. Moreover, when the phase difference $(\Delta\phi)$ between the $(P_1+S_1)$ test heterodyned signal and the $(P2+S_2)$ reference heterodyned signal is n $\pi+\delta$, where n is an integer, and $\delta$ is between 0 and $\pi$, the signal processing device 51 can further include a counter 512 for recording n pulse signals from the amplitude-demodulator output, such that the phase difference $(\delta)$ can be calculated from the amplitude $|I_{out}|=|4\ \gamma\chi \sin(\frac{1}{2}\delta)|$ or $\delta=2\ \sin^{-1}(|I_{out}|/4\gamma\chi)$. In view of the variables $(n, \delta)$, the phase measurement range can be extended.

Finally, as with the previous embodiment, an amplitude demodulator (AD) 510 of the signal processing device 51 detects the amplitude of the differential amplifier output with enhanced detecting speed and sensitivity.

Figure 5:
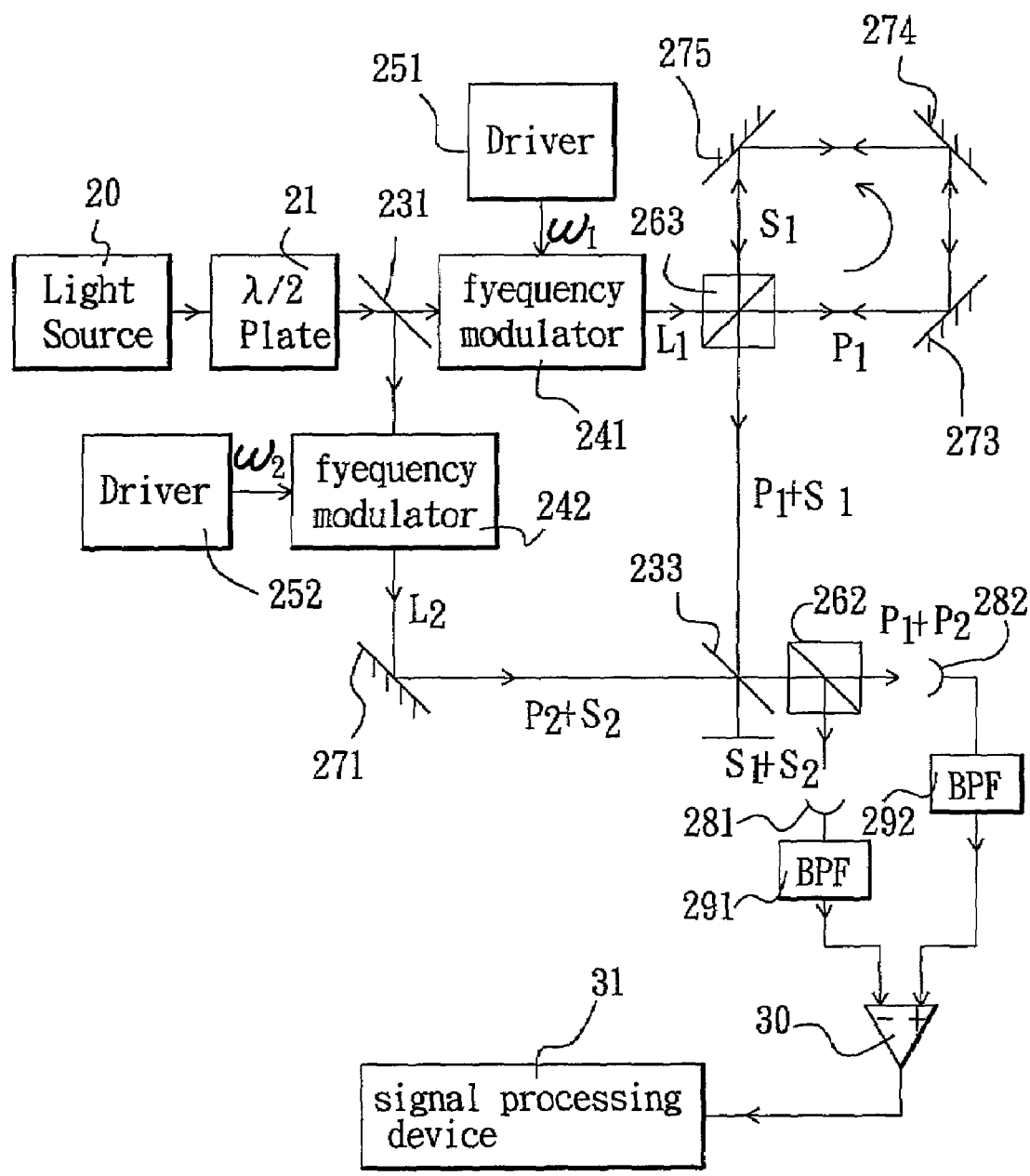
FIG. 5 illustrates a modification of the interferometric system of FIG. 2.

FIG. 5 illustrates another preferred embodiment of an interferometric system according to this invention. Unlike the embodiment of FIG. 2, after the signal beam $L_1$ has been processed by the frequency modulator 241, a polarizing beam splitter 263 will split the signal beam $L_1$ into the mutually orthogonal linear polarized $P_1$ and $S_1$ components. The $P_1$ and $S_1$ components are fed in opposite directions into a ring-type optical path unit, which serves as the test object. In this embodiment, the ring-type optical path unit includes three planar mirrors 273, 274, 275 which reflect the $P_1$ and $S_1$ components at right angles and which cooperate to form a ring-shaped optical path for the transmission of the $P_1$ and $S_1$ components in opposite directions. The $P_1$ and $S_1$ components are subsequently recombined in the polarizing beam splitter 263.

Like the embodiment of FIG. 2, the $P_2$ and $S_2$ components of the reference beam are combined with the $P_1$ and $S_1$ components of the signal beam at the beam splitter 233. The output of the beam splitter 233 is received by a polarized beam splitter 262 so as to generate mutually orthogonal linear polarized P-wave (i.e. $P_1+P_2$) and S-wave (i.e. $S_1+S_2$) heterodyned signals. When the ring-type optical path unit rotates, the optical paths of the $P_1$ and $S_1$ components change, thereby resulting in a corresponding change in the detected phase. The construction as such is known as a common path ring interferometer used to measure rotation or changes in the environment of the interferometer, such as electromagnetic field, etc.

As with the embodiment of FIG. 2, the P-wave and S-wave heterodyned signals from the polarized beam splitter 262 are detected by a respective photo detector 281, 282 for conversion into a corresponding electrical signal output. The electrical signal outputs from the photo detectors 281, 282 are provided to a respective band pass filter 291, 292. A differential amplifier 30 receives the filtered outputs from the band pass filters 291, 292, obtains an intensity difference between the filtered outputs, and amplifies the intensity difference. The output of the differential amplifier 30 is as defined in the following Equation (29):

$$I_{out}(\Delta\omega t)=|4\ \gamma\Theta\ \sin(\tfrac{1}{2}\Delta\phi)|\sin(\Delta\omega t) \qquad \text{Equation 29}$$

where $\Theta=\sqrt{I_{P1}I_{S1}}=\sqrt{I_{P2}I_{S2}}$ and is the intensity of the P-wave and S-wave heterodyned signals, $(I_{P1}, I_{S1})$ and $(I_{P2}, I_{S2})$ are the intensities of P-wave and S-wave components in the signal channel and the reference channel of the interferometer, respectively, and $(\Delta\phi)$ is the phase change introduced to the $P_1$ and $S_1$ components by the ring-type optical path unit. When $|\Delta\phi|<10°$, Equation (29) can be rewritten as follows:

$$I_{out}(\Delta\omega t)=|2\ \gamma\Theta(\Delta\phi)|\sin(\Delta\omega t) \qquad \text{Equation (30)}$$

From the foregoing, it is evident that the amplitude of the differential amplifier output is proportional to the measured phase difference. Like the embodiment of FIG. 2, by incorporating a feedback loop for generating a control signal that corresponds to the measured phase difference, nulling of the phase difference can be performed so as to achieve accurate control of the phase change. In addition, the detecting sensitivity is $2\ \gamma\Theta$ times of the phase difference.

FIG. 6 illustrates yet another preferred embodiment of an interferometric system according to this invention. Unlike the embodiment of FIG. 3, the $(P_1+S_1)$ signal beam from the beam splitter 431 is passed through a polarizing beam splitter 462 so as to split the same into the mutually orthogonal linear polarized $P_1$ and $S_1$ components. The $P_1$ and $S_1$ components are then fed in opposite directions into a ring-type optical path unit, which serves as a test object. In this embodiment, the ring-type optical path unit includes three planar mirrors 472, 473, 474 which reflect the $P_1$ and $S_1$ components at right angles and which cooperate to form a ring-shaped optical path for the transmission of the $P_1$ and $S_1$ components in opposite directions. The $P_1$ and $S_1$ components are subsequently recombined in the polarizing beam splitter 462.

Like the embodiment of FIG. 3, the $P_1$ and $S_1$ components of the signal beam, which are of mutually orthogonal polarization and which do not interfere with each other, are subsequently passed through a polarization analyzer 421, thereby enabling the $P_1$ and $S_1$ components to interfere with each other along a polarizing direction of the polarization analyzer 421 to result in a test heterodyned signal. Thus, when the ring-type optical path unit rotates, the optical paths of the $P_1$ and $S_1$ components change, thereby resulting in a corresponding change in the detected phase. The construction as such is known as a two-frequency polarized ring interferometer.

As with the embodiment of FIG. 3, photo detectors 481, 482 convert the optical heterodyned signals from the polarization analyzers 421, 422 into corresponding electrical signals, which are filtered by two band pass filters 491, 492, respectively. The outputs of the band pass filters 491, 492 are provided to a differential amplifier 50. The output of the differential amplifier 50 is as defined in the following Equation (31):

$$I_{out}(\Delta\omega t)=|4\ \gamma\Gamma\ \sin(\tfrac{1}{2}\Delta\phi)|\sin(\Delta\omega t) \qquad \text{Equation 31}$$

where $\Gamma=\sqrt{I_{P1}I_{S1}}\sin 2\Theta_s\sqrt{I_{P2}I_{S2}}\sin 2\Theta_r$, as defined in the embodiment of FIG. 3, and is the intensity of the heterodyned $P_1+S_1$ wave and $P_2+S_2$ wave heterodyned signals. $(\Delta\phi)$ is the phase change introduced to the $P_1$ and $S_1$ components by the ring-type optical path unit. When $|\Delta\phi|<10°$, Equation (31) can be rewritten as follows:

$$I_{out}(\Delta\omega t)=|2\ \gamma\Gamma(\Delta\phi)|\sin(\Delta\omega t) \qquad \text{Equation 32}$$

From the foregoing, it is evident that the amplitude of the differential amplifier output is proportional to the measured phase difference. Like the embodiment of FIG. 3, by incorporating a feedback loop for generating a control signal that corresponds to the measured phase difference, the interferometric system can be implemented as an optical rotation sensor. At the same time, nulling of the phase difference is possible for accurate control of the phase change.

FIG. 7 illustrates still another preferred embodiment of an interferometric system according to the present invention. Unlike the embodiment of FIG. 5, which uses a three-mirroring-type optical path unit, the optical path unit of the present embodiment is a polarization maintain single mode optical fiber unit 60. The interferometric system is thus a fiber optical ring interferometer suitable for use in real time measurement of angular rotation and electromagnetic field intensity and in optical sensor control.

The phase difference detector of the present invention can be further applied to a Michelson interferometer. As shown in FIG. 8, linear polarized light from a light source 70, such as a single-frequency linear polarized stabilized He—Ne laser, is passed through a polarization angle adjusting device 71, such as a $\lambda/2$ plate, for adjusting the azimuth angle. A beam splitter 731 then separates the light into a $(P_1+S_1)$ signal beam and a $(P_2+S_2)$ reference beam.

The $(P_1+S_1)$ signal beam is received by a polarized beam splitter 761 to separate the same into mutually orthogonal linear polarized $P_1$ and $S_1$ components that are fed in opposite directions into a polarization maintain single mode optical fiber unit 60. The $P_1$ and $S_1$ components are subsequently recombined in the polarized beam splitter 761, and are reflected by a mirror 772 to a beam splitter 732.

The $(P_2+S_2)$ reference beam is incident upon and is reflected by a constant-speed moving mirror 771 such that a Doppler frequency shift is introduced into the frequency of the reference beam due to movement of the mirror 771. When the moving speed of the mirror 771 is fixed at $(v_o)$, a beat frequency $(\Delta\omega)$ will be presented in both the $P_2$ and $S_2$ components and is equal to $(4\ \pi/\lambda)v_o=2(\omega_0/C)v_o$. The beat frequency $(\Delta\omega)$ is the Doppler frequency attributed to the constant-speed movement of the mirror 771. The reference beam is combined with the signal beam at the beam splitter 732. The output of the beam splitter 732 is received by a polarized beam splitter 762 so as to generate mutually orthogonal linear polarized P-wave (i.e. $P_1+P_2$) and S-wave (i.e. $S_1+S_2$) optical heterodyned signals. The P-wave and S-wave optical heterodyned signals are detected by a respective photo detector 781, 782 for conversion into a corresponding electrical signal output. The electrical signal outputs from the photo detectors 781, 782 are provided respectively to two band pass filters 791, 792, whose center frequency is $\Delta\omega$, so as to obtain filtered heterodyned signals with a fixed frequency $\Delta\omega$, as defined in the following Equations (33) and (34):

$$I_{P1+P2}(\Delta\omega t)=2\sqrt{I_{P1}I_{P2}}\cos(2k\Delta 1(t)+\Delta\phi_P) \quad \text{Eq. (33)}$$

$$I_{S1+S2}(\Delta\omega t)=2\sqrt{I_{S1}I_{S2}}\cos(2k\Delta 1(t)+\Delta\phi_S) \quad \text{Eq. (34)}$$

where $k=2\pi/\lambda$, and $\Delta 1$ is the difference in the path lengths of the signal and reference beams. By adjusting the azimuth angle of the polarization angle adjusting device 71 such that $\sqrt{I_{S1}I_{S2}}=\sqrt{I_{P1}I_{P2}}=\rho$, and by introducing a phase shift $\frac{1}{2}(\Delta\phi_P+\Delta\phi_S)$ in the phase coordinate for the reason described hereinabove, Equations (33) and (34) can be rewritten as follows:

$$I_{P1+P2}(\Delta\omega t)=2\sqrt{I_{P1}I_{P2}}\cos[2k\Delta 1(t)+\frac{1}{2}(\Delta\phi_P-\Delta\phi_S)]=2\rho\cos(\Delta\omega t+\frac{1}{2}\Delta\phi) \quad \text{Equations (35)}$$

$$I_{S1+S2}(\Delta\omega t)=2\sqrt{I_{P1}I_{P2}}\cos[2k\Delta 1(t)+\frac{1}{2}(\Delta\phi_P-\Delta\phi_S)]=2\rho\cos(\Delta\omega t+\frac{1}{2}\Delta\phi) \quad \text{Equations (36)}$$

A differential amplifier 80 receives the filtered heterodyned signals from the bandpass filters 791, 792, obtains an intensity difference between the filtered heterodyned signals, and amplifies the intensity difference. The output of the differential amplifier 80 is as defined in the following Equation (37):

$$I_{out}(\Delta\omega t)=\gamma[I_{P1+P2}(\Delta\omega t)-I_{S1+S2}(\Delta\omega t)]=|4\gamma\rho\sin(\frac{1}{2}\Delta\omega t)| \quad \text{Equation 37}$$

In Equations (35) to (37), ($I_{P1}$, $I_{P2}$) are the intensities of the $P_1$ and $P_2$ components, ($I_{S1}$, $I_{S2}$) are the intensities of the $S_1$ and $S_2$ components, ($\Delta\phi_P$) is the phase difference between the $P_1$ and $P_2$ components, ($\Delta\phi_S$) is the phase difference between the $S_1$ and $S_2$ components, ($\Delta\omega$) is the beat frequency of the heterodyned signals, $\gamma$ is the gain of the differential amplifier 80, and $\Delta\phi=\Delta\phi_P-\Delta\phi_S$, and is the phase difference between the P-wave and S-wave heterodyned signals.

It is evident from Equation (37) that the amplifier output $I_{out}(\Delta\omega t)$ is an amplitude-modulated signal with a carrier frequency $\Delta\omega$.

In the present embodiment, a signal processing device 81 includes an amplitude demodulator (AD) 810 for measuring the amplitude $|4\gamma\rho\sin(\frac{1}{2}\Delta\phi)|$ of the differential amplifier output, thus permitting the calculation of the phase difference ($\Delta\phi$) in a manner similar to that of the previous embodiment. Moreover, when $|\Delta\phi|<10°$, the amplifier output can be further simplified as $I_{out}(\Delta\omega t)=|2\gamma\rho(\Delta\phi)|\sin(\Delta\omega t)$. Accordingly, the measured amplitude-modulated signal is proportional to the phase difference ($\Delta\omega$). Thus, with the use of the signal processing device 81, the phase difference ($\Delta\omega$) can be precisely measured. Also, with the inclusion of a feedback loop that generates a control signal corresponding to the phase difference ($\Delta\phi$) for phase difference nulling purposes, precise control of the phase change is possible. In addition, the range of phase measurement can be extended with the use of a digital counter and a phase comparator in a manner similar to that described beforehand. Furthermore, the detecting sensitivity is $2\gamma\rho$ times ($\Delta\phi$), which is much higher than that obtained in the prior art.

Figure 9:
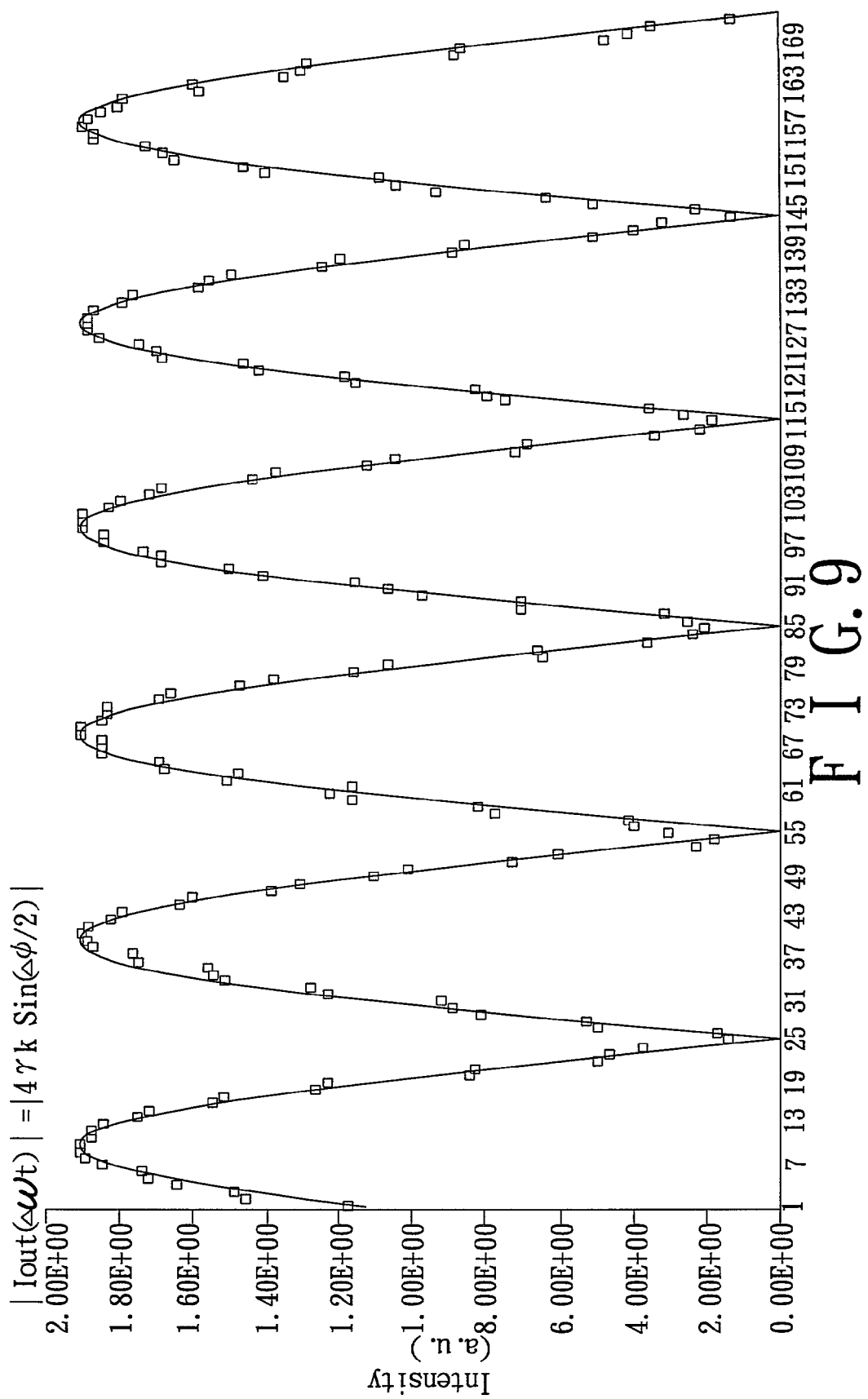
FIG. 9 is a plot of experimental results obtained with the use of the interferometric system of FIG. 2.

FIG. 9 is a plot illustrating the real-time measurement of phase difference ($\Delta\phi$) with the use of the interferometric system of FIG. 2. The test object is a planar mirror driven by a piezoelectric transducer. The $P_1$ and $S_1$ components of the signal beam are incident upon and are reflected by a mirror and the test object, respectively. The position of the planar mirror of the $P_1$ reflecting surface is adjusted, and the amplitude of the modulation signal from the differential amplifier was measured in real-time. The observed results match the theoretical results defined in Equation (19). This proves the utility and the sensitivity of the phase measuring method of this invention.

In passing, it is worthwhile to note that the above-described concept of this invention is also applicable to single or two-frequency light sources that generate mutually orthogonal circular or elliptical polarized components, albeit with a slight modification.

I claim:

1. A phase demodulator for measuring a phase difference between a phase-modulated test signal $I_s(\omega t)=2k_1\cos(\omega t+\psi_s)$ and a phase-modulated reference signal $I_r(\omega t)=2k_2\cos(\omega t+\psi_r)$, the test and reference signals having fixed carrier frequencies ($\omega$), a phase difference ($\Delta\psi$) being equal to ($\psi_s-\psi_r$), said phase demodulator comprising:

an amplitude control device for adjusting amplitudes of the test and reference signals to satisfy the condition $k_1=k_2=k$;

a differential amplifier, coupled to said amplitude control device, for receiving the amplitude-adjusted test and reference signals from said amplitude control device, for obtaining an intensity difference between the amplitude-adjusted test and reference signals, and for amplifying the intensity difference to generate an amplitude-modulated output $I_{out}(\omega t)$ equal to $|4\gamma k\sin(\frac{1}{2}\Delta\psi)|\sin(\omega t)$, where $\gamma$ is the gain of said differential amplifier; and a signal processing device comprising:
   an amplitude demodulator coupled to said differential amplifier, said amplitude demodulator demodulating the amplitude-modulated output from said differential amplifier to obtain an output that is related to the phase difference ($\Delta 104$); and
   a phase comparator, coupled to said amplitude control device, for determining a sign of the phase difference ($\Delta\psi$) from the amplitude-adjusted test and reference signals and for determining an increasing or decreasing direction of change in the phase difference ($\Delta\psi$).

2. The phase demodulator of claim 1, wherein said amplitude control device includes a pair of automatic gain control units that receive the test and reference signals, respectively.

3. The phase demodulator of claim 1, wherein the phase difference ($\Delta\psi$) is equal to $|I_{out}|/2\gamma k$ when the absolute value of the phase difference ($\Delta\psi$) is between 0 and 10°, wherein said signal processing device further includes a differentiator for generating a time-differentiated output $d/dt\,|I_{out}(\omega t)|$ from the amplitude-demodulator output, where $d/dt\,|I_{out}(\omega t)|=2\gamma k\,d/dt\,|\Delta\psi|=2\gamma k\omega_s$, and where ($\omega_s$) is equal to $d/dt\,|\Delta\psi|$ and is an instantaneous frequency.

4. The phase demodulator of claim 1, wherein said signal processing device further includes a feedback loop capable of generating a control signal that corresponds to the phase difference ($\Delta\psi$) for phase difference nulling purposes.

5. A phase difference detector adapted for use with a polarized optical interferometer that generates two mutually orthogonal polarized optical signals, at least one of which is incident upon a test object, the optical signals having equal intensities and carrier frequencies and being processed to obtain two electrical signals that are a function of a frequency, a time, and a phase difference between the two mutually orthogonal polarized optical signals, said phase difference detector comprising:

a differential amplifier adapted to receive the electrical signals, to obtain an intensity difference between the electrical signals, and to amplify the intensity difference to generate an amplitude-modulated output that is a function of a phase difference between the electrical signals; and a signal processing device comprising:

an amplitude demodulator coupled to said differential amplifier, said amplitude demodulator demodulating the amplitude-modulated output from said differential amplifier to obtain an output that is related to the phase difference; and a counter such that when the phase difference between the electrical signals exceeds $2\pi$, the phase difference as detected by said signal processing device includes a product of $2\pi$ and an integer recorded by said counter.

6. An interferometric system, comprising:

a coherent light source;

an interferometer for separating light from said coherent light source into a signal beam and a reference beam, each of which includes two mutually orthogonal linear polarized components, the signal and reference beams having a beat frequency therebetween, at least one of the components of the signal beam being incident upon a test object, the signal and reference beams being combined and then separated into two mutually orthogonal linear polarized optical heterodyned signals that have equal intensities and equal carrier frequencies and that are a function of a beat frequency, a time, and a phase difference between each of the mutually orthogonal linear polarized components;

a photo detecting means for converting the two mutually orthogonal linear polarized optical heterodyned signals into two electrical signals;

a differential amplifier coupled to said photo detecting means so as to receive the electrical signals therefrom, said differential amplifier obtaining an intensity difference between the electrical signals, and amplifying the intensity difference to generate an amplitude-modulated output that is a function of a phase difference between the two mutually orthogonal linear polarized optical heterodyned signals; and a signal processing device comprising:

an amplitude demodulator coupled to said differential amplifier, said amplitude demodulator demodulating the amplitude-modulated output from said differential amplifier to obtain an output that is related to the phase difference; and a phase comparator, coupled to said photo detecting means, for determining a sign of the phase difference ($\Delta\psi$) and for determining a direction of change in the position of the test object.

7. The interferometric system of claim 6, wherein:

said coherent light source is a single-frequency stabilized laser;

said interferometer including a polarization angle adjusting device for adjusting an azimuth angle of the light from said coherent light source, said polarization angle adjusting device being adjustable such that the intensities of the signal and reference beams satisfy the condition $\sqrt{I_{P1}I_{P2}}=\sqrt{I_{S1}I_{S2}}=K$, where $I_{P1}$ and $I_{S1}$ are the intensities of the mutually orthogonal linear polarized $P_1$ and $S_1$ components of the signal beam, $I_{P2}$ and $I_{S2}$ are the intensities of the mutually orthogonal linear polarized $P_2$ and $S_2$ components of the reference beam, said interferometer further including a beam splitter for splitting the light from said polarization angle adjusting device into the signal and reference beams, and first and second frequency modulators for modulating the signal and reference beams at different modulating frequencies, respectively, thereby generating the beat frequency ($\Delta\omega$);

one of the mutually orthogonal linear polarized optical heterodyned signals being $I_{P1+P2}(\Delta\omega t)$ that includes the $P_1$ and $P_2$ components and that is equal to $2K\cos(\Delta\omega t+\Delta\psi_p)$, where $\Delta\psi_p$ is the phase difference between the $P_1$ and $P_2$ components, the other one of the mutually orthogonal linear polarized optical heterodyned signals being $I_{S1+S2}(\Delta\omega t)$ that includes the $S_1$ and $S_2$ components and that is equal to $2K\cos(\Delta\omega t+\Delta\psi_s)$, where $\Delta\psi_s$ is the phase difference between the $S_1$ and $S_2$ components;

the magnitude of the amplitude-modulated output being $|4\gamma K\sin(\frac{1}{2}\Delta\psi)|$, where $\gamma$ is the gain of said differential amplifier, and $\Delta\psi=\Delta\psi_{p-\Delta\psi_s}$.

8. The interferometric system of claim 6, wherein said signal processing device further includes a feedback loop capable of generating a control signal that corresponds to the phase difference ($\Delta\psi$) and that can be used to adjust an optical path of at least one of the components of the signal and reference beams, thereby permitting the phase difference ($\Delta\psi$) to be maintained within a narrow range that encompasses an initial phase difference value ($\Delta\psi_0$).

9. The interferometric system of claim 7, wherein said interferometer further includes a polarized beam splitter for splitting the signal beam into the $P_1$ and $S_1$ components, the test object being a ring-type optical path unit, said polarized beam splitter being disposed between said first frequency modulator and the test object, feeding the $P_1$ and $S_1$ components to the test object in opposite directions, and recombining the $P_1$ and $S_1$ components from the test object.

10. The interferometric system of claim 9, wherein said optical path unit includes a plurality of planar mirrors.

11. The interferometric system of claim 9, wherein said optical path unit includes a polarization maintain single mode optical fiber.

12. The interferometric system of claim 6, wherein:

said coherent light source is a single-frequency stabilized linear polarized laser;

said interferometer including a polarization angle adjusting device for adjusting an azimuth angle of the light from said coherent light source, said polarization angle adjusting device being adjustable such that the intensities of the signal and reference beams satisfy the condition $\sqrt{I_{P1}I_{P2}}=\sqrt{I_{S1}I_{S2}}=\rho$, where $I_{P1}$ and $I_{S1}$ are the intensities of the mutually orthogonal linear polarized $P_1$ and $S_1$ components of the signal beam, $I_{P2}$ and $I_{S2}$ are the intensities of the mutually orthogonal linear polarized $P_2$ and $S_2$ components of the reference beam, said interferometer further including a position-movable mirror that moves at a predetermined speed for introducing a Doppler frequency shift to the frequency of at least one of the signal and reference beams, thereby resulting in the beat frequency between the signal and reference beams;

one of the mutually orthogonal linear polarized optical heterodyned signals being $I_{P1+P2}(\Delta\omega t)$ that includes the $P_1$ and $P_2$ components and that is equal to $2\rho \cos(\Delta\omega t+\Delta\psi_P)$, where $\Delta\psi_P$ is the phase difference between the $P_1$ and $P_2$ components, the other one of the mutually orthogonal linear polarized optical heterodyned signals being $I_{S1+S2}(\Delta\omega t)$ that includes the $S_1$ and $S_2$ components and that is equal to $2\rho \cos(\Delta\omega t+\Delta\psi_S)$, where $\Delta\psi_S$ is the phase difference between the $S_1$ and $S_2$ components;

the magnitude of the amplitude-modulated output of said differential amplifier being $|4\gamma\rho \sin(½\Delta\psi)|$, where $\gamma$ is the gain of said differential amplifier, and $\Delta\psi=\Delta\psi_P-\Delta\psi_S$.

13. The interferometric system of claim 12, wherein said signal processing device further includes a feedback loop for adjusting an optical path of at least one of the components of the signal and reference beams, thereby permitting the phase difference ($\Delta\psi$) to be maintained within a narrow range that encompasses an initial phase difference value ($\Delta\psi_o$).

14. The interferometric system of claim 12, wherein said signal processing device further includes a phase comparator, coupled to said photo detecting means, for determining a sign of the phase difference ($\Delta\psi$), and for determining a direction of change in the position of the test object.

15. An interferometric system, comprising:
a coherent light source;
an interferometer for separating light from said coherent light source into a signal beam and a reference beam, each of which includes two mutually orthogonal linear polarized components, the two mutually orthogonal linear polarized components of the signal and reference beams having a beat frequency therebetween, at least one of the components of the signal beam being incident upon a test object, the signal and reference beams being converted into two optical heterodyned signals that have equal intensities and carrier frequencies and that are a function of a beat frequency, a time, and a phase difference between the mutually orthogonal linear polarized components;
a photo detecting means for converting the optical heterodyned signals into two electrical signals;
a differential amplifier coupled to said photo detecting means so as to receive the electrical signals therefrom, said differential amplifier obtaining an intensity difference between the electrical signals, and amplifying the intensity difference to generate an amplitude-modulated output that is a function of a phase difference between the optical heterodyned signals; and
a signal processing device comprising:
an amplitude demodulator coupled to said differential amplifier, said amplitude demodulator demodulating the amplitude-modulated output from said differential amplifier to obtain an output that is related to the phase difference; and
a phase comparator, coupled to said photo detecting means, for determining a sign of the phase difference ($\Delta\omega$) and for determining a direction of change in the position of the test object.

16. The interferometric system of claim 15, wherein:
said coherent light source is a two-frequency laser;
said interferometer including a beam splitter for splitting the light from said coherent light source into the signal and reference beams, the reference beam including mutually orthogonal linear polarized $P_2$ and $S_2$ components having the beat frequency therebetween, the signal beam including mutually orthogonal linear polarized $P_1$ and $S_1$ components having the beat frequency therebetween, at least one of the $P_1$ and $S_1$ components being incident upon the test object;
said interferometer further including first and second polarization analyzers, each of which receives a respective one of the signal and reference beams, and causes the respective mutually orthogonal linear polarized components of the signal and reference beams to interfere with each other along a polarization direction thereof, each of said first and second polarization analyzers having an azimuth angle that is adjustable such that the intensities of the mutually orthogonal linear polarized components of the signal and reference beams satisfy the condition $\sqrt{I_{P1}I_{S1}}\sin 2\theta_s=\sqrt{I_{P2}I_{S2}}\sin 2\theta_r=2\chi$, where $I_{P1}$ and $I_{S1}$ are the intensities of the $P_1$ and $S_1$ mutually orthogonal linear polarized components of the signal beam, $I_{P2}$ and $I_{S2}$ are the intensities of $P_2$ and $S_2$ mutually orthogonal linear polarized components of the reference beam, $\theta_s$ is the azimuth angle of said first polarization analyzer for the signal beam, $\theta_r$ is the azimuth angle of said second polarization analyzer for the reference beam;
a one of the two optical heterodyned signals $I_{sig}(\Delta\omega t)$ for the signal beam being equal to $2\chi \cos(\Delta\omega t+\Delta\psi_{sig})$, another one of the two optical heterodyned signals $I_{ref}(\Delta\omega t)$ for the reference beam being equal to $2\chi \cos(\Delta\omega t+\Delta\psi_{ref})$, where $\Delta\omega$ is the beat frequency, $\Delta\psi_{sig}$ is a phase difference between the $P_1$ and $S_1$ mutually orthogonal linear polarized components of the signal beam, and $\Delta\psi_{ref}$ is a phase difference between the $P_2$ and $S_2$ mutually orthogonal linear polarized components of the reference beam; the magnitude of the amplitude-modulated output of said differential amplifier being $|4 \gamma\chi \sin(½\Delta\psi)|$, where $\gamma$ is the gain of said differential amplifier, and $\Delta\psi=\Delta\psi_{ref}-\Delta\psi_{sig}$.

17. The interferometric system of claim 16, wherein said signal processing device further includes a feedback loop for adjusting an optical path of at least one of the components of the signal and reference beams, thereby permitting the phase difference ($\Delta\psi$) to be maintained within a narrow range that encompasses an initial phase difference value ($\Delta\psi_o$).

18. The interferometric system of claim 16, wherein said interferometer further includes a polarized beam splitter for splitting the signal beam into the $P_1$ and $S_1$ mutually orthogonal linear polarized components, the test object being a ring-type optical path unit, said polarized beam splitter feeding the $P_1$ and $S_1$ mutually orthogonal linear polarized components to the test object in opposite directions, and recombining the $P_1$ and $S_1$ components from the test object.

19. The interferometric system of claim 18, wherein said optical path unit includes a plurality of planar mirrors.

20. The interferometric system of claim 18, wherein said optical path unit includes a polarization maintain single mode optical fiber.

* * * * *